(12) United States Patent
Patel et al.

(10) Patent No.: US 9,748,697 B2
(45) Date of Patent: Aug. 29, 2017

(54) PLUGGABLE CONNECTOR AND INTERCONNECTION SYSTEM CONFIGURED FOR RESONANCE CONTROL

(71) Applicants: Tyco Electronics Corporation, Berwyn, PA (US); TYCO ELECTRONICS JAPAN G.K., Kawasaki-shi (JP)

(72) Inventors: Sandeep Patel, Middletown, PA (US); Linda Ellen Shields, Camp Hill, PA (US); Bruce Allen Champion, Camp Hill, PA (US); Chad William Morgan, Carneys Point, NJ (US); Masayuki Aizawa, Machida (JP)

(73) Assignees: TE CONNECTIVITY CORPORATION, Berwyn, PA (US); TYCO ELECTRONICS JAPAN G.K., Kawasaki-Shi (JP)

( * ) Notice: Subject to any disclaimer, the term of this patent is extended or adjusted under 35 U.S.C. 154(b) by 120 days.

(21) Appl. No.: 14/798,536

(22) Filed: Jul. 14, 2015

(65) Prior Publication Data
US 2017/0018881 A1 Jan. 19, 2017

(51) Int. Cl.
*H01R 13/66* (2006.01)
*H01R 13/6471* (2011.01)
*H05K 1/02* (2006.01)
*H05K 1/11* (2006.01)

(52) U.S. Cl.
CPC ..... *H01R 13/6471* (2013.01); *H01R 13/6616* (2013.01); *H05K 1/023* (2013.01); *H05K 1/0228* (2013.01); *H05K 1/117* (2013.01); *H05K 2201/09409* (2013.01)

(58) Field of Classification Search
CPC ............ H01R 13/6658; H01R 23/7073; H01R 13/421
USPC .......................... 439/620, 76.1, 609, 79, 701
See application file for complete search history.

(56) References Cited

U.S. PATENT DOCUMENTS

| | | | |
|---|---|---|---|
| 6,932,649 B1* | 8/2005 | Rothermel | H01R 13/6658 439/620.01 |
| 8,298,009 B2* | 10/2012 | Elkhatib | H01R 12/594 439/581 |
| 2005/0121224 A1* | 6/2005 | Lien | H05K 1/182 174/250 |
| 2014/0065856 A1* | 3/2014 | Regnier | H01R 13/6658 439/108 |

(Continued)

*Primary Examiner* — Phuongchi T Nguyen (57) ABSTRACT

Pluggable connector includes a plug housing configured to couple to a communication cable. The plug housing has a plug cavity. The pluggable connector also includes a module board that is disposed within the plug cavity and configured to be communicatively coupled to the communication cable. The module board has a mating edge configured to interface with a mating connector. The module board includes a plurality of signal pathways and a plurality of ground pathways in which the signal pathways are interleaved between corresponding ground pathways. The signal and ground pathways include respective contact pads that are disposed proximate to the mating edge for engaging corresponding contacts of the mating connector. Each of the ground pathways has separate first and second trace segments and a damping component that electrically joins the first and second trace segments.

20 Claims, 7 Drawing Sheets (56) References Cited

U.S. PATENT DOCUMENTS

2014/0266516 A1 9/2014 Xiao et al.

* cited by examiner

PLUGGABLE CONNECTOR AND INTERCONNECTION SYSTEM CONFIGURED FOR RESONANCE CONTROL

BACKGROUND

The subject matter herein relates generally to pluggable electrical connectors that have signal pathways configured to convey data signals and ground pathways that reduce crosstalk between the signal pathways.

Communication systems exist today that utilize pluggable cable assemblies to transmit data. For example, network systems, servers, data centers, and the like may use numerous cable assemblies to interconnect the various devices of the communication system. Cable assemblies may include a pluggable electrical connector (referred to herein as pluggable connector) that is configured to be inserted into a receptacle assembly of a communication system. The pluggable connector includes signal pathways and ground pathways in which the signal pathways convey data signals and the ground pathways control impedance and reduce crosstalk between the signal conductors. In differential signaling applications, the signal pathways are arranged in signal pairs for carrying the data signals. Each signal pair may be separated from an adjacent signal pair by one or more ground pathways.

The pluggable connectors may be configured to transfer electrical signals in accordance with industry standards. By way of example, known industry standards for pluggable connectors include small-form factor pluggable (SFP), enhanced SFP (SFP+), quad SFP (QSFP), C form-factor pluggable (CFP), and 10 Gigabit SFP, which is often referred to as XFP. Among other things, these standards may require that the pluggable connectors have certain physical configurations or structures.

There has been a general demand to increase the speeds at which data is transmitted through the communication systems. As data rates increase, however, it becomes more challenging to maintain a baseline level of signal quality. For example, electrical energy that flows along the surface of each ground pathway may form a field that propagates between the ground pathways. The ground pathways may couple with each other to support an unwanted electrical propagation mode that is repeatedly reflected and forms a resonating condition (or standing wave). Electrical noise caused by the resonating condition may increase return loss and/or crosstalk and reduce throughput of the interconnection system.

To control resonance between ground pathways and limit the effects of the resulting electrical noise, it has been proposed to electrically common the ground pathways using a metal conductor or a lossy plastic material. The effectiveness and/or cost of implementing these techniques is based on a number of variables, such as the geometries of the signal and ground pathways within the interconnection system. Moreover, these techniques are usually applied to the receptacle assembly that receives the pluggable connector. It may be difficult to implement these and other techniques in pluggable connectors due to the structural requirements for pluggable connectors that are set by the industry standards.

Accordingly, there is a need for pluggable connectors that reduce the electrical noise caused by resonating conditions in ground pathways.

BRIEF DESCRIPTION

In an embodiment, a pluggable connector is provided that includes a plug housing configured to couple to a communication cable. The plug housing has a plug cavity. The pluggable connector also includes a module board that is disposed within the plug cavity and configured to be communicatively coupled to the communication cable. The module board has a mating edge configured to interface with a mating connector. The module board includes a plurality of signal pathways and a plurality of ground pathways in which the signal pathways are interleaved between corresponding ground pathways. The signal and ground pathways include respective contact pads that are disposed proximate to the mating edge for engaging corresponding contacts of the mating connector. Each of the ground pathways has separate first and second trace segments and a damping component that electrically joins the first and second trace segments. In an exemplary embodiment, the damping component includes one or more resistors. In some embodiments, the damping component may be a capacitor or inductor or, in other embodiments, may be a plurality of interconnected resistors, capacitors, and/or inductors.

In an embodiment, an interconnection system is provided that includes a receptacle connector configured to be mounted to a circuit board. The receptacle connector having a front side and a receiving cavity that opens to the front side. The receptacle connector includes an array of electrical contacts disposed within the receiving cavity that are configured to be terminated to the circuit board. The interconnection system also includes a pluggable connector that is configured to be inserted into the receiving cavity of the receptacle connector during a mating operation. The pluggable connector includes a module board having a plurality of signal pathways and a plurality of ground pathways in which the signal pathways are interleaved between corresponding ground pathways. The signal and ground pathways include respective contact pads that are disposed proximate to a mating edge of the module board for engaging corresponding electrical contacts of the receptacle connector. Each of the ground pathways has separate first and second trace segments and a damping component that electrically joins the first and second trace segments.

DETAILED DESCRIPTION

Embodiments set forth herein may include various pluggable electrical connectors (referred to herein as pluggable connectors) that are configured for communicating data signals. Embodiments may also include cable assemblies or interconnection systems that include the pluggable connectors. The pluggable connectors are configured to mate with a corresponding mating connector, such as a receptacle connector. Various embodiments are particularly suitable for high-speed communication systems, such as network systems, servers, data centers, and the like, in which the data rates may be greater than four (4) gigabits/second (Gbps). Particular embodiments may be capable of transmitting data at a rate of at least about 10 Gbps, at least about 20 Gbps, at least about 28 Gbps, at least about 56 Gbps, or more. However, it is also contemplated that embodiments may transmit at slower transmission speeds or data rates.

Embodiments include conductive pathways that may include one or more interconnected conductive elements, such as traces and vias. The conductive pathways include signal and ground pathways that are positioned relative to each other to form a designated pattern that is suitable for communicating data signals at the desired data rate. In particular embodiments, the signal pathways form signal pairs in which each signal pair is flanked on both sides by ground pathways. The ground pathways electrically separate the signal pairs to reduce electromagnetic interference or crosstalk and to provide a reliable ground return path. Other embodiments, however, may not include signal pairs. For example, each signal pathway may be flanked on both sides by ground pathways.

For embodiments that include signal pairs, the signal and ground pathways may form multiple sub-arrays. Each sub-array includes, in order, a ground pathway, a signal pathway, a signal pathway, and a ground pathway. This arrangement is referred to as ground-signal-signal-ground (or GSSG) sub-array. The sub-array may be repeated such that an exemplary row of conductors may form G-S-S-G-G-S-S-G-G-S-S-G, wherein two ground pathways are positioned between two adjacent signal pairs. In the illustrated embodiment, however, adjacent signal pairs share a ground conductor such that the pattern forms G-S-S-G-S-S-G-S-S-G. In both examples above, the sub-array may be referred to as a GSSG sub-array. More specifically, the term "GSSG sub-array" includes sub-arrays that share one or more intervening ground conductors.

Figure 1:
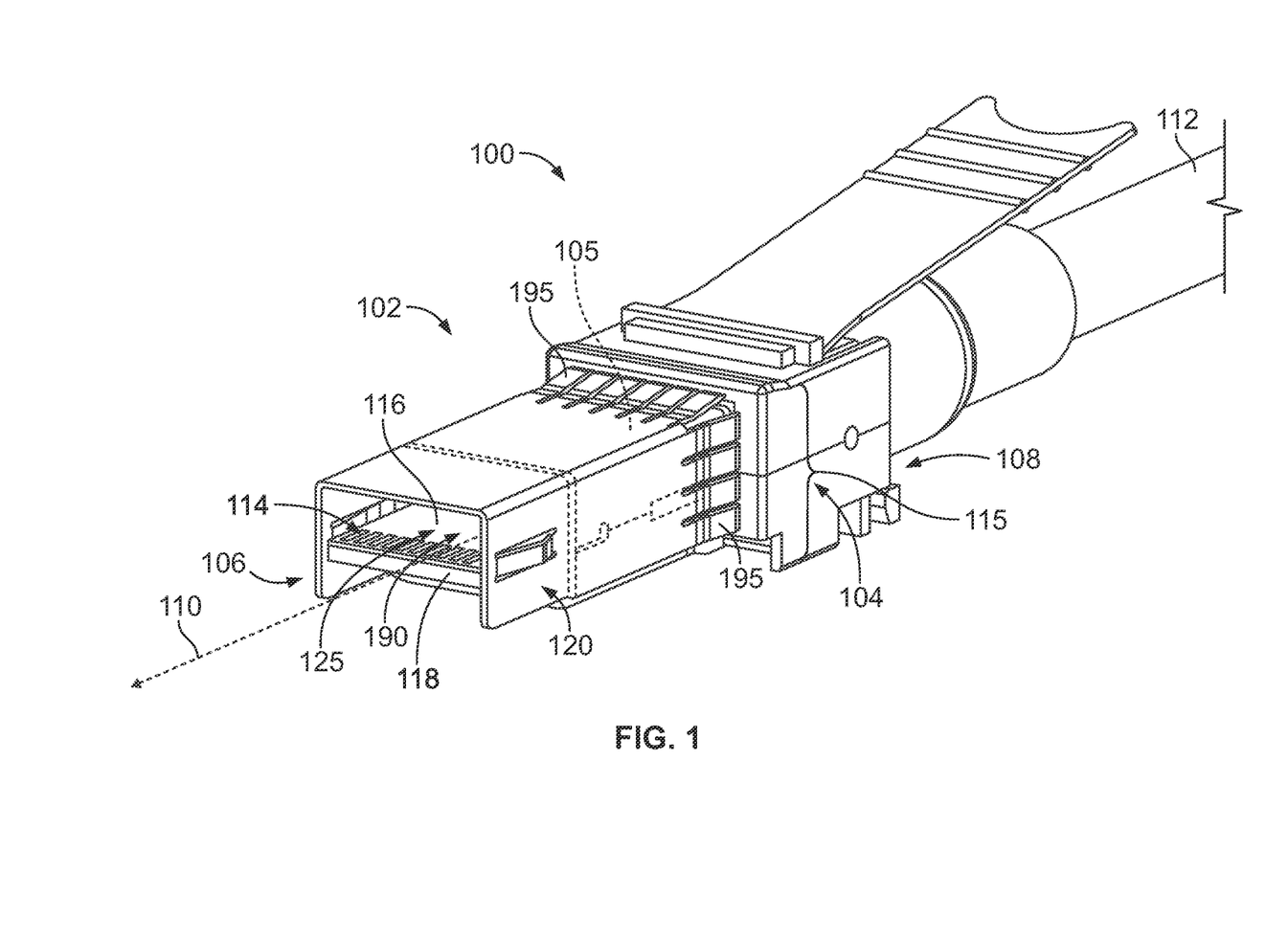
FIG. 1 is a perspective view of a pluggable cable assembly that includes a pluggable connector formed in accordance with an embodiment.

FIG. 1 is a perspective view of a pluggable cable assembly 100 having a pluggable connector 102 formed in accordance with an embodiment. The pluggable connector 102 is configured to be inserted into a receptacle assembly 200 (shown in FIG. 3) and engage a receptacle or mating connector 202 (shown in FIG. 3) within the receptacle assembly 200 during a mating operation. In some applications, the pluggable connector 102 may be referred to as a pluggable transceiver connector or as a pluggable input/output (I/O) connector. The pluggable connector 102 has a mating end 106 and a loading end 108. As shown, a central axis 110 extends between the mating and loading ends 106, 108. The cable assembly 100 includes a communication cable (or cable harness) 112 that is coupled to the pluggable connector 102 at the loading end 108.

The cable assembly 100 and pluggable connector 102 may be configured for various applications. Non-limiting examples of such applications include host bus adapters (HBAs), redundant arrays of inexpensive disks (RAIDs), workstations, servers, storage racks, high performance computers, or switches. The cable assembly 100 may be configured to be compliant with industry standards, such as, but not limited to, the small-form factor pluggable (SFP) standard, enhanced SFP (SFP+) standard, quad SFP (QSFP) standard, C form-factor pluggable (CFP) standard, and 10 Gigabit SFP standard, which is often referred to as the XFP standard.

The communication cable 112 is configured to transfer data signals to and/or from a contact array 114 of the pluggable connector 102 that is disposed proximate to the mating end 106. The communication cable 112 may be permanently attached to the pluggable connector 102 or separably attached to the pluggable connector 102.

The pluggable connector 102 includes a plug housing 104 that is configured to be directly or indirectly coupled to the communication cable 112. In the illustrated embodiment, the pluggable connector 102 also includes an optional electromagnetic interference (EMI) skirt 120 that is coupled to the plug housing 104. The EMI skirt 120 may be removed in other embodiments. The plug housing 104 includes a connector base 115 and a plug extension 105 that extends from the connector base 115 along the central axis 110.

Figures 3, 4:
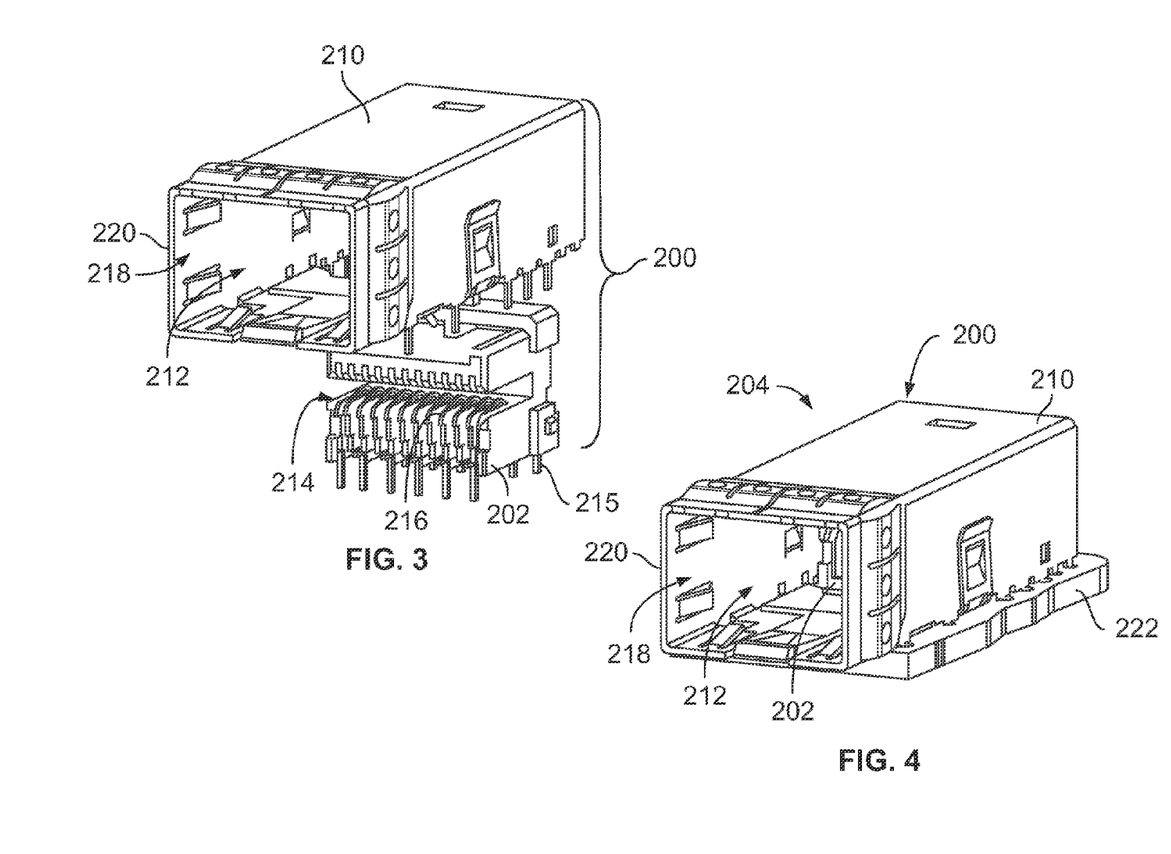
FIG. 3 is an exploded view of a receptacle assembly that may mate with the pluggable connector of FIG. 1.
FIG. 4 is a perspective view of the fully constructed receptacle assembly shown in FIG. 3.

The connector base 115 represents a portion of the plug housing 104 that is not inserted into the receptacle assembly 200 (FIG. 3). The plug extension 105 represents the portion of the plug housing 104 that is inserted into the receptacle assembly 200. In FIG. 1, the plug extension 105 is received within a plug passage 190 of the EMI skirt 120. Accordingly, the plug extension 105 is indicated in phantom in FIG. 1. The plug extension 105 and the EMI skirt 120 form a plug cavity 125 that is configured to have at least a portion of a module board 116 of the pluggable connector 102 disposed therein. For embodiments that do not include the EMI skirt 120, the plug cavity 125 may only be defined by the plug extension 105 or the plug housing 104.

The EMI skirt 120 includes spring beams 195 that are positioned adjacent to the plug extension 105 and proximate to the connector base 115. In other embodiments, the spring beams 195 may be positioned away from the connector base 115. The spring beams 195 are configured to directly engage the plug extension 105 and the receptacle assembly 200 (FIG. 3) to establish a ground pathway between the pluggable connector 102 and the communication system. In alternative embodiments, the pluggable connector 102 does not include an EMI skirt 120 and, instead, the receptacle assembly 200 includes spring beams that engage the plug connector 102.

The module board 116 has the contact array 114 proximate to a mating edge 118 of the module board 116. The plug housing 104 is configured to surround at least a portion of the module board 116 and other circuitry of the pluggable connector 102 to contain the EMI emissions generated. The plug housing 104 may be conductive and may surround the module board 116 and other internal circuitry about the central axis 110. The EMI skirt 120 surrounds the plug extension 105 and is also configured to contain the EMI emissions generated by the pluggable connector 102.

Figure 2:
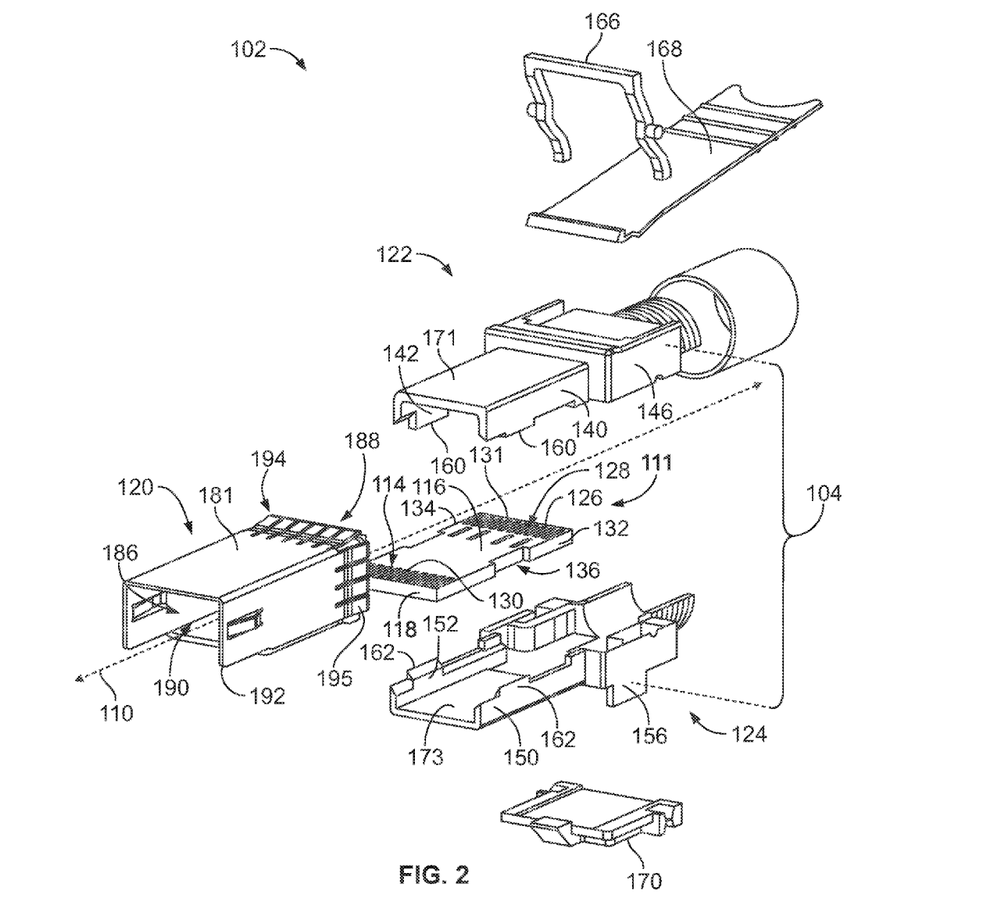
FIG. 2 is an exploded view of the pluggable connector of FIG. 1.

FIG. 2 is an exploded view of the pluggable connector 102. In the illustrated embodiment, the plug housing 104 is formed from a pair of housing shells 122, 124. Each of the housing shells 122, 124 may define a portion of the connector base 115 (FIG. 1) and a portion of the plug extension 105 (FIG. 1). The housing shells 122, 124 may be molded from a conductive material, such as a polymer with embedded conductive particles. In other embodiments, the plug housing 104 or the housing shells 122, 124 may include an exterior and/or interior conductive plating.

The module board 116 includes a trailing edge 126 that also includes a contact array 128. The trailing edge 126 and the mating edge 118 are located on opposite ends of the module board 116. The contact arrays 114, 128 are communicatively coupled to each other by conductive pathways (not shown) extending through the module board 116. The contact arrays 114, 128 include electrical contacts 130, 131, respectively, which are contact pads in an exemplary embodiment. The electrical contacts 130 may be referred to as mating pads, and the electrical contacts 131 may be referred to as terminating pads. The module board 116 also includes a pair of side edges 132, 134 that face in opposite directions. Each of the side edges 132, 134 forms a corresponding recess 136.

Figure 6:
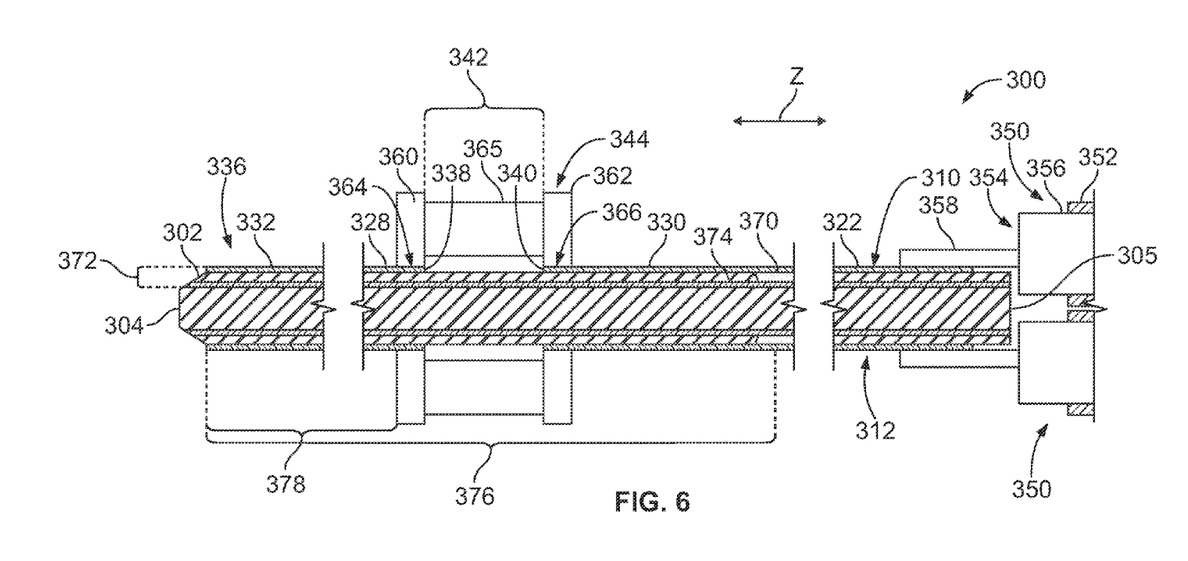
FIG. 6 is a side view of different portions of the module board of FIG. 5.

In an exemplary embodiment, the communication cable 112 (FIG. 1) includes a plurality of insulated wires, such as the insulated wires 354 (shown in FIG. 6), that are stripped to expose wire conductors, such as the wire conductors 358 (shown in FIG. 6). The exposed wire conductors are terminated to the electrical contacts 131 of the contact array 128. Although not shown, the module board 116 may include one or more processing units attached thereto that modify the data signals during operation. In some embodiments, the module board 116, the processing unit(s), the exposed conductors, and the communication cable 112 may collectively form internal circuitry 111 of the pluggable connector 102.

When the pluggable connector 102 is assembled, the module board 116 is positioned between the housing shells 122, 124 and the housing shells 122, 124 are joined to each other. The housing shell 122 includes side portions 140, 142 and a plug side 171 that extends between and joins the side portions 140, 142. The housing shell 122 includes a base portion 146. The plug side 171 and the side portions 140, 142 project from the base portion 146 along the central axis 110. Similarly, the housing shell 124 includes side portions 150, 152 and a plug side 173 that extends between and joins the side portions 150, 152. The housing shell 124 includes a base portion 156. The plug side 173 and the side portions 150, 152 project from the base portion 156 along the central axis 110.

The housing shells 122, 124 form the plug housing 104 when joined together with the module board 116 at least partially therebetween. In the illustrated embodiment, the plug sides 171, 173 and the side portions 140, 142, 150, 152 collectively form the plug extension 105 (FIG. 1). The base portions 146, 156 combine to form the connector base 115 (FIG. 1). The module board 116 may be held at a designated position between the housing shells 122, 124. For example, each of the side portions 140, 142 includes a board projection 160, and each of the side portions 150, 152 includes a board projection 162. When the housing shells 122, 124 are joined, each of the recesses 136 of the module board 116 receives one of the board projections 160 and one of the board projections 162. The board projections 160, 162 may operate as positive stops that block the module board 116 from moving along the central axis 110.

The EMI skirt 120 defines a connector-receiving opening 186 and a plug-receiving opening 188. The plug passage 190 extends between the connector-receiving and plug-receiving openings 186, 188. The EMI skirt 120 defines a front edge 192 that is configured to be inserted into the receptacle assembly 200 (FIG. 3) before the module board 116. A back portion 194 of the EMI skirt 120 includes the spring beams 195. The spring beams 195 surround the central axis 110. When the pluggable connector 102 is assembled, the plug extension 105 (FIG. 1) is inserted through the plug-receiving opening 188. The spring beams 195 are configured to engage the plug extension 105 and also engage the receptacle assembly 200.

Also shown in FIG. 2, the pluggable connector 102 may include a release mechanism that includes a lever 166, a pull tab 168, and an actuator 170. The lever 166 is configured to couple to the pull tab 168 and engage the actuator 170. When the pluggable connector 102 is mated with the receptacle assembly 200 (FIG. 3), the pull tab 168 may be pulled away from the connector base 115 to rotate the lever 166 and activate the actuator 170. The actuator 170 may move to dislodge the pluggable connector 102 from the receptacle assembly 200.

FIG. 3 is an exploded view of the receptacle assembly 200, and FIG. 4 is a perspective view of a circuit board assembly 204 that includes a fully constructed receptacle assembly 200. The receptacle assembly 200 includes a receptacle cage 210 that defines the receiving cavity 212 and the receptacle connector 202 that is disposed within the receiving cavity 212. The receptacle connector 202 has an edge slot 214 (FIG. 3) that is sized and shaped to receive the mating edge 118 (FIG. 1) of the module board 116 (FIG. 1). The receptacle connector 202 includes electrical contacts 215, 216 (FIG. 3) that are arranged in two rows along respective opposite sides of the edge slot 214 and configured to engage the electrical contacts 130 (FIG. 2) proximate to the mating edge 118 of the module board 116.

The receptacle cage 210 has a cage edge 220 that defines a port or opening 218 that provides access to the receiving cavity 212. The cage edge 220 may engage the spring beams 195 (FIG. 1) of the EMI skirt 120 (FIG. 1) during the mating operation. As shown in FIG. 4, the circuit board assembly 204 includes a circuit board 222. The receptacle assembly 200 is mounted to and electrically coupled to the circuit board 222. The electrical contacts 215, 216 (FIG. 3) are terminated to the circuit board 222. Although not shown, the circuit board assembly 204 may also include a panel or bezel having an opening that aligns with the port 218.

Figure 5:
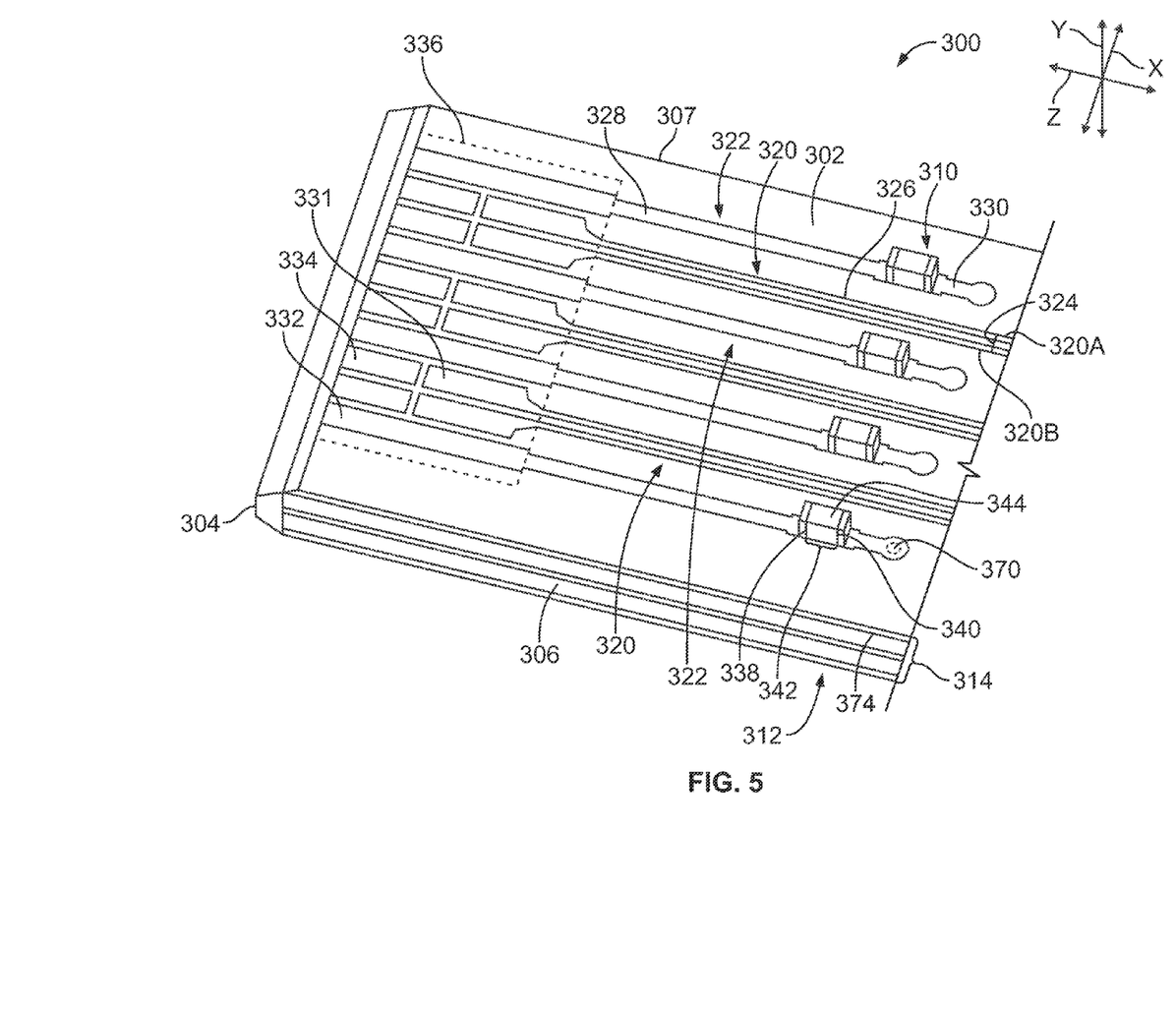
FIG. 5 is an isolated perspective view of a portion of a module board that may be used with a pluggable connector formed in accordance with an embodiment.

FIG. 5 is an isolated perspective view of a portion of a module board 300 that may be used with a pluggable connector (not shown), such as the pluggable connector 102 (FIG. 1) formed in accordance with an embodiment. The module board 300 may replace the module board 116 (FIG. 1) in some embodiments. For example, the module board 300 may be disposed within the plug cavity 125 (FIG. 1) of the plug housing 104 (FIG. 1). For reference, the module board 300 is oriented with respect to X-, Y-, and Z-axes, which are mutually perpendicular. The Z-axis is configured to extend parallel to the central axis 110 (FIG. 1).

The module board 300 includes a board body 302 having board edges 304, 305 (shown in FIG. 6), 306, 307 that define a profile of the board body 302. The board edges 304-307 may be specifically referred to as a mating edge 304, a trailing edge 305 (FIG. 6), and side edges 306, 307. The mating edge 304 is located opposite the trailing edge 305. The side edges 306, 307 extend between the mating and trailing edges 304, 305. The mating and trailing edges 304, 305 extend generally parallel to the X-axis, and the side edges 306, 307 extend generally parallel to the Z-axis. The board body 302 has board surfaces 310, 312 that face in opposite directions along the Y-axis. A thickness 314 of the board body 302 is defined between the board surfaces 310, 312. The board surfaces 310, 312 extend parallel to an XZ plane. The module board 300 includes a plurality of ground planes 374.

The module board 300 may be manufactured through a variety of fabrication technologies. For example, the module board 300 may be manufactured through printed circuit board (PCB) technologies. The module board 300 may be a laminate or sandwich structure that includes a plurality of stacked substrate layers having conductive elements that extend between the substrate layers (e.g., traces, ground planes, and the like) or extend through the substrate layers (e.g., vias, plated thru-holes, and the like). By way of example, the substrate layers may include a dielectric material (e.g., flame-retardant epoxy-woven glass board (FR4), FR408, polyimide, polyimide glass, polyester, epoxy-aramid, metals, and the like). The substrate layers may also include a bonding material (e.g., acrylic adhesive, modified epoxy, phenolic butyral, pressure-sensitive adhesive (PSA), preimpregnated material, and the like). The conductive elements may be disposed, deposited, or etched in a predetermined manner within or along the substrate layers. By way of example, the conductive elements may comprise copper (or a copper-alloy), cupro-nickel, silver epoxy, and the like. In alternative embodiments, the module board 300 may constitute a lead frame having conductive elements deposited within a dielectric body formed through, for example, injection molding.

The following is with specific reference to features along the board surface 310. It should be understood that the description may also be applied to the board surface 312. The module board 300 includes a plurality of signal pathways 320 and a plurality of ground pathways 322. Each signal pathway 320 includes a signal trace 326, and each ground pathway 322 includes first and second trace segments 328, 330. The signal and ground pathways 320, 322 extend generally parallel to one another and parallel to the Z-axis. At least portions of the signal and ground pathways 320, 322 are coplanar and are exposed along the board surface 310.

The signal pathways 320 are interleaved between corresponding ground pathways 322. In the illustrated embodiment, the signal pathways 320 are configured for differential signaling such that the signal pathways 320 are arranged to form signal pairs 324. Each signal pair 324 includes two signal pathways 320, which are specifically designated as 320A, 320B, that extend immediately adjacent to each other without conductive elements therebetween. Each signal pair 324 is flanked by two of the ground pathways 322. In other embodiments, however, each signal pathway 320 may be flanked by two of the ground pathways 322 such that the signal pathways 320 do not extend immediately adjacent to each other. In other embodiments, more than one ground pathway 322 may exist between two of the signal pairs 324.

Figure 8:
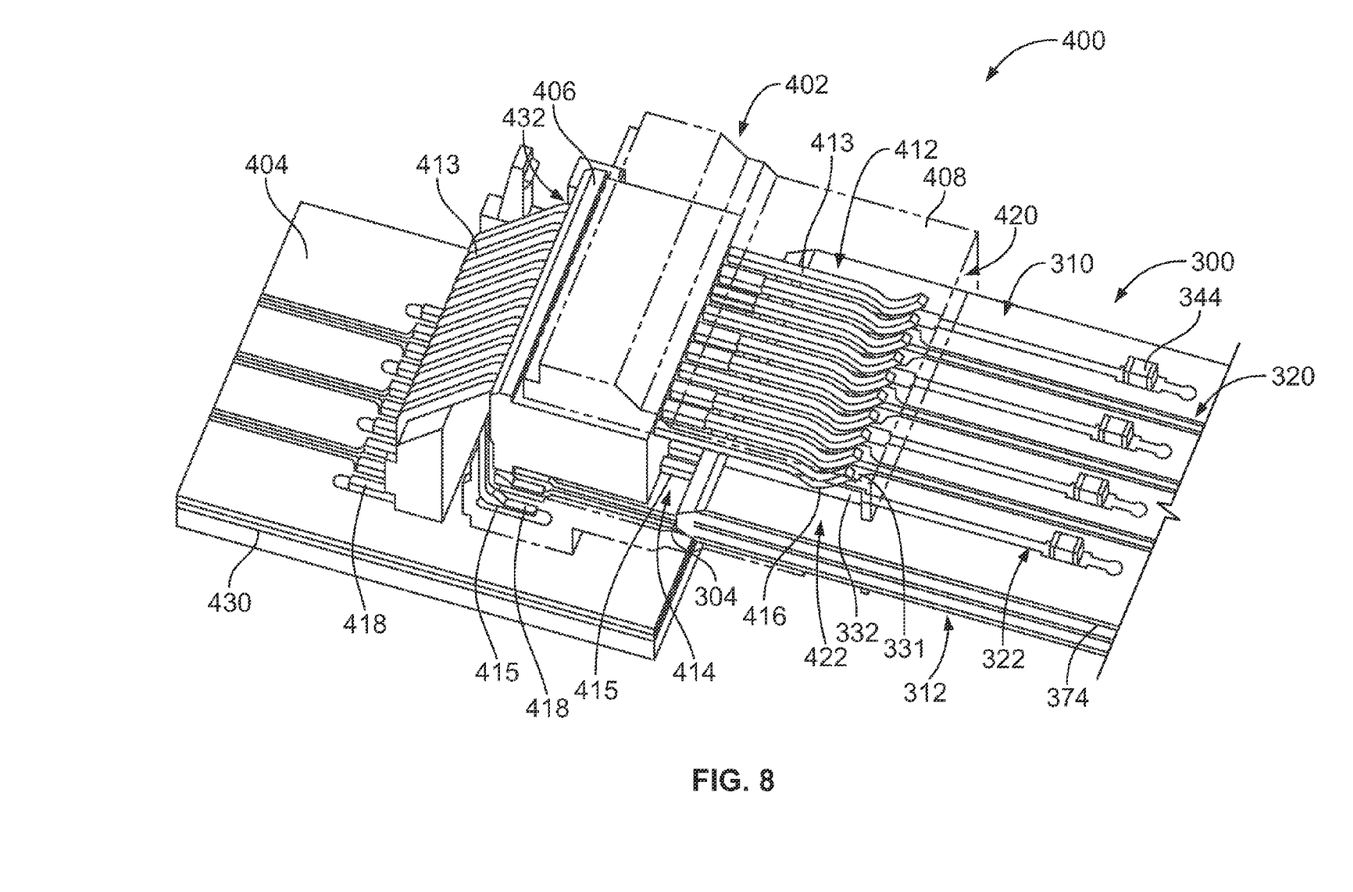
FIG. 8 is a perspective view of an interconnection system that utilizes the module board of FIG. 5. Components have been removed from the interconnection system for illustrative purposes.

Each of the signal pathways 320 includes a contact pad (or mating pad) 331 that is located proximate to the mating edge 304 for engaging a corresponding electrical contact 413 (shown in FIG. 8) of the receptacle connector 402 (shown in FIG. 8). Each of the ground pathways 322 includes a contact pad 332 that is located proximate to the mating edge 304 for engaging a corresponding electrical contact 413 of the receptacle connector 402. The signal and ground pathways 320, 322 form G-S-S-G sub-arrays. In the illustrated embodiment, the module board 300 also includes optional board pads 334. Each of the board pads 334 is located between a corresponding contact pad 331 and the mating edge 304. The board pads 334 are configured to engage the corresponding electrical contacts 413 prior to the contact pads 331 engaging the corresponding electrical contacts 413. In some embodiments, the board pads 334 may reduce wear or damage caused by the electrical contacts 413 to the board body 302. The contact pads 331, 332 and the board pads 334 are grouped together within a mating zone or area 336 (indicated by dashed box) along the board surface 310.

Each of the first and second trace segments 328, 330 forms a corresponding portion of a ground pathway 322. The first and second trace segments 328, 330 include trace ends 338, 340, respectively, that are spaced from each other by a gap 342. As described herein, the ground pathways 322 also include damping (or resonance-control) components 344 that extend across the gap 342 and electrically couple the first and second trace segments 328, 330. As described herein, the damping components 344 may impede the formation of standing waves (or resonating conditions) at certain frequencies. In an exemplary embodiment, the damping component 344 includes a single resistor. However, in other embodiments, the damping component 344 may include one or more interconnected resistors, capacitors, or inductors. The second trace segment 330 extends between the trace end 340 and a ground via 370 that extends into the board body 302.

In the illustrated embodiment, the module board 300 is shaped along the mating edge 304 for engaging and deflecting electrical contacts 413, 415 (shown in FIG. 8) of a receptacle connector 402 (shown in FIG. 8). For example, the mating edge 304 may be chamfered. In alternative embodiments, however, the mating edge 304 may not be chamfered.

FIG. 6 illustrates different portions of a cross-section of the module board 300. Although the following is described with specific reference to features along the board surface 310, the module board 300 may include similar or identical features along the board surface 312. The module board 300 is configured to be electrically coupled to a communication cable, such as the communication cable 112 (FIG. 1), along the trailing edge 305. In an exemplary embodiment, the communication cable includes a plurality of twinax (or twin-axial) cables 350. FIG. 6 shows two separate twinax cables 350 in which one twinax cable 350 couples to the board surface 310 and another twinax cable 350 couples to the board surface 312. Each twinax cable 350 includes a cable jacket 352 and a pair of insulated wires 354 that are surrounded by the corresponding cable jacket 352. Because FIG. 6 shows a side view, only one of the insulated wires 354 is shown for each twinax cable 350. A shield layer (not shown) may also surround the pair of insulated wires 354.

Each insulated wire 354 includes an insulation layer 356 and a wire conductor 358 that is surrounded by the corresponding insulation layer 356. The insulation layers 356 may be stripped to expose the corresponding wire conductors 358 for terminating to the module board 300. Although the wire conductors 358 appear to be terminated to the ground pathways 322 in FIG. 6, the wire conductors 358 are terminated to terminating pads (not shown) of corresponding signal pathways 320 (FIG. 5). The terminating pads may be similar or identical to the electrical contacts 131 (FIG. 2). Each signal pathway 320 extends between a corresponding contact pad 331 (FIG. 5) and a corresponding terminating pad. Optionally, the twinax cables 350 may include one or more drain wires (not shown) that may be terminated to the ground pathways 322.

The first and second trace segments 328, 330 are spaced apart by the gap 342. In some embodiments, the damping component 344 is a discrete resistor that may be positioned across or within the gap 342. For example, after the board surface 310 is fabricated (e.g., etched, polished), the damping resistor 344 may be positioned onto the board surface 310. The damping resistor 344 may be an off-the-shelf resistor having a designated resistance, such as 50 Ohm. It is contemplated, however, that the damping resistor 344 may be fabricated during the manufacture of the module board 300. For example, in other embodiments, the damping resistor 344 may comprise a lossy plastic material that is deposited along the board surface 310. Furthermore, although the ground pathway 322 has only a single damping resistor 344, other embodiments may include a series of damping resistors 344. In other embodiments, the damping component 344 may include a capacitor or inductor that is discrete and/or provided through the manufacturing of the module board 300.

In FIG. 6, the damping component 344 extends across the gap 342 and electrically couples the first and second trace segments 328, 330. The damping component 344 includes first and second terminals 360, 362 that are mechanically and electrically coupled to the first and second trace segments 328, 330, respectively. More specifically, the first trace segment 328 forms a platform surface 364 proximate to the trace end 338, and the second trace segment 330 forms a platform surface 366 proximate to the trace end 340. The platform surfaces 364, 366 are exposed along the board surface 310 and correspond to the areas of the first and second trace segments 328, 330, respectively, that the damping component 344 engages. A conductive adhesive or solder (not shown) may be used to mechanically and electrically couple the first and second terminals 360, 362 to the first and second trace segments 328, 330, respectively.

In FIG. 6, the first and second terminals 360, 362 appear to be distinguishable with respect to a bridge portion 365 of the damping component 344 that extends between the first and second terminals 360, 362. In other embodiments, the first and second terminals 360, 362 may not be distinguishable with respect to the bridge portion 365. For example, the first and second terminals 360, 362 and the bridge portion 365 may have the same dimensions. In such embodiments, end portions of the damping component 344 may represent the terminals 360, 362 of the damping component 344.

The ground via 370 extends a depth 372 into the board body 302 to electrically couple to one of the ground planes 374. Each of the ground pathways 322 along the board surface 310 may be electrically coupled to a common ground plane 374 such that the ground pathways 322 along the board surface 310 are electrically common. Each of the ground pathways 322 has an electrical path length 376 that extends approximately between the ground via 370 and the corresponding contact pad 332. In some embodiments, a majority of the ground pathway 322 is linear along the electrical path length 376 such that the electrical path length 376 may be measured along the Z-axis. The electrical path length 376 includes the depth 372, but the depth 372 is nominal in the illustrated embodiment.

The damping component 344 may have a designated location along the electrical path length 376 that is configured to impede formation of a standing wave or resonating condition. In FIG. 6, the designated location is a predetermined distance 378 from a front edge of the contact pad 332. The predetermined distance 378 may be determined through calculations and/or simulations of a proposed pluggable connector design. Alternatively or in addition to, the predetermined distance 378 may be determined through multiple tests or trials of the pluggable connector. The designated location may also be configured to satisfy an industry standard. For example, an industry standard may require that the mating zone 336 or space near the mating zone 336 must be free from other components, such as components located along the board surface 310. As a specific example, an industry standard may require a sufficient amount of space after the mating zone 336 that may be occupied by the receptacle connector 402 (FIG. 8) after the mating operation.

Accordingly, the predetermined distance 378 may be configured to satisfy an industry standard and also to achieve a designated electrical performance. In some embodiments, the predetermined distance 378 causes the damping component 344 to be closer to the ground plane 374 than the contact pad 332. In particular embodiments, the predetermined distance 378 causes the damping component 344 to be within one-third of the electrical path length 376 from the ground plane 374. In more particular embodiments, the predetermined distance 378 causes the damping component 344 to be within one-fifth of the electrical path length 376 from the ground plane 374.

Figure 7:
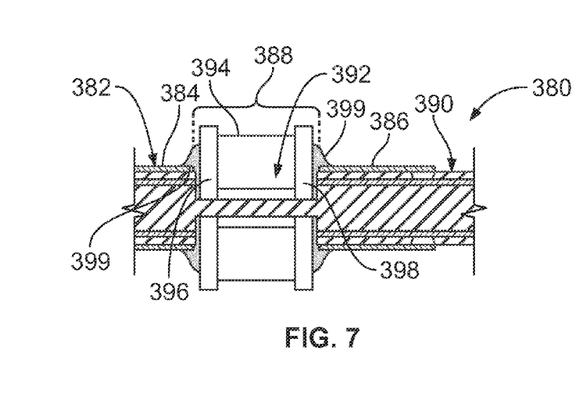
FIG. 7 is a side view of an isolated portion of a module board formed in accordance with an embodiment.

FIG. 7 illustrates an enlarged portion of a module board 380 that may be similar to the module board 300 (FIG. 6). For example, the module board 380 includes a ground pathway 382 having first and second trace segments 384, 386 spaced from each other by a gap 388. The first and second trace segments 384, 386 are positioned along a board surface 390 of the module board 380. In the illustrated embodiment, the board surface 390 forms a component recess 392 that is sized and shaped to receive a damping component 394. The component recess 392 extends between and separates the first and second trace segments 384, 386. The damping component 394 has opposite first and second terminals 396, 398. The first and second terminals 396, 398 are disposed within the component recess 392 and mechanically and electrically coupled to the first and second trace segments 384, 386, respectively, through a conductive material 399. The conductive material 399 may be, for example, an adhesive material or solder.

As such, the damping component 394 electrically joins the first and second trace segments 384, 386. In the illustrated embodiment, the damping component 394 is only partially disposed within the component recess 392 such that the damping component 394 clears the board surface 390. In other embodiments, a top of the damping component 394 may be flush or level with the board surface 390 or located a depth within the component recess 392.

FIG. 8 is a perspective view of an interconnection system 400. For illustrative purposes, only a portion of the module board 300, a receptacle connector 402, and a circuit board 404 are shown. The module board 300 may be part of a pluggable connector, such as the pluggable connector 102 (FIG. 1). The receptacle connector 402 may be part of a receptacle assembly (not shown), such as the receptacle assembly 200 (FIG. 3), and be disposed within a receptacle cage (not shown), such as the receptacle cage 210.

The receptacle connector 402 includes an inner housing 406 and an outer housing 408 (shown in phantom) that surrounds the inner housing 406. The receptacle connector 402 has a front side 420 that is defined by the outer housing 408. The outer housing 408 includes a receiving cavity 422 that opens to the front side 420. The receiving cavity 422 has a first array 412 of electrical contacts 413 and a second array 414 of electrical contacts 415 disposed therein. As shown, the electrical contacts 413, 415 extend through the inner housing 406 and through a back side 432 of the inner housing 406. The electrical contacts 413, 415 are terminated to the circuit board 404.

The electrical contacts 413 of the first array 412 are configured to engage the board surface 310 of the module board 300, and the electrical contacts 415 of the second array 414 are configured to engage the board surface 312. Each of the electrical contacts 413, 415 has a contact interface 416 that is configured to engage the module board 300 within the receiving cavity 422. Each of the electrical contacts 413, 415 has an end portion 418 that is terminated to the circuit board 404.

A pluggable connector, such as the pluggable connector 102 (FIG. 1), that includes the module board 300 is configured to be mated with the receptacle connector 402. During the mating operation, the mating edge 304 of the module board 300 engages the contact interfaces 416 of the electrical contacts 413, 415. The electrical contacts 413, 415 are deflected away from each other, and the contact interfaces 416 of the electrical contacts 413, 415 slide along the board surfaces 310, 312, respectively. After the mating operation, the contact interfaces 416 engage corresponding contact pads of the module board 300. More specifically, the contact interfaces 416 of electrical contacts that transmit data signals engage the contact pads 331, and the contact interfaces 416 of electrical contacts that provide a ground path engage the contact pads 332.

During operation of the interconnection system 400, data signals are transmitted through the signal pathways 320 and electrical energy flows along the surface of each ground pathway 322. The electrical energy flowing along the ground pathways 322 may form a field that propagates between the ground pathways 322. Without the damping components 344, the field may reflect and form a standing wave (or resonating condition) at certain frequencies. The field may reflect, for example, between the ground planes 374 of the module board 300 and ground planes 430 of the circuit board 404. The damping components 344 are configured to impede the development of these standing waves (or resonating conditions) at certain frequencies and, consequently, reduce the unwanted effects of the electrical noise. For example, in some embodiments, the damping components 344 may absorb some of the electrical energy and drain the electrical energy. In some embodiments, the damping components 344 effectively change or dampen the reflections such that the standing wave (or the resonating condition) is not formed during operation of the interconnection system 400.

Figure 9:
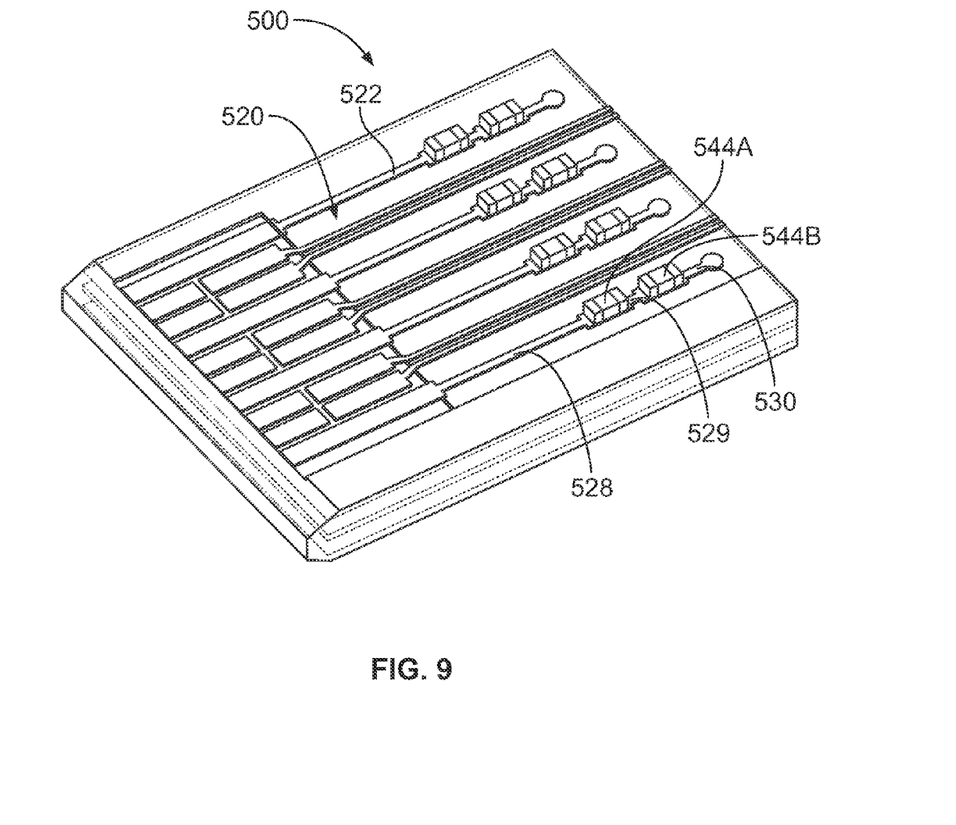
FIG. 9 is an isolated perspective view of a portion of a module board that may be used with a pluggable connector formed in accordance with an embodiment.

FIG. 9 is an isolated perspective view of a portion of a module board 500 that may be used with a pluggable connector (not shown), such as the pluggable connector 102 (FIG. 1) formed in accordance with an embodiment. The module board 500 may be similar to the module board 300 (FIG. 5). For example, the module board 500 includes a plurality of signal pathways 520 and a plurality of ground pathways 522. Each of the ground pathways 522 includes first, second, and third trace segments 528, 529, 530, respectively. Unlike the module board 300, however, each of the ground pathways 522 includes a series of damping components 544A, 544B. The damping component 544A electrically couples the first and second trace segments 528, 529. The damping component 544B electrically couples the second and third trace segments 529, 530. In an exemplary embodiment, the damping components 544A, 544B are discrete resistors. In other embodiments, however, the damping resistors are not discrete. In other embodiments, the damping components 544A, 544B include one or more capacitors or one or more inductors.

It is to be understood that the above description is intended to be illustrative, and not restrictive. Moreover, the above-described embodiments (and/or aspects thereof) may be used in combination with each other. In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." An element recited in the singular and proceeded with the word "a" or "an" should be understood as not excluding plural of said elements, unless such exclusion is explicitly stated. Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A pluggable connector comprising:
   a plug housing configured to couple to a communication cable, the plug housing having a plug cavity; and
   a module board disposed within the plug cavity and configured to be communicatively coupled to the communication cable, the module board having a mating edge configured to interface with a mating connector, the module board having a board surface and including a plurality of signal pathways and a plurality of ground pathways in which the signal pathways are interleaved between corresponding ground pathways, the signal and ground pathways including respective contact pads that are disposed proximate to the mating edge for engaging corresponding contacts of the mating connector, wherein each of the ground pathways has separate first and second trace segments, the first trace segments of the ground pathways including the respective contact pads, the second trace segments of each ground pathway being separate from the second trace segments of each of the other ground pathways along the board surface, each of the ground pathways further comprising a damping component that electrically joins the first and second trace segments of the corresponding ground pathway along the board surface.

2. The pluggable connector of claim 1, wherein the module board includes a component recess that extends between and separates the first and second trace segments, the damping component being at least partially disposed within the component recess.

3. The pluggable connector of claim 1, wherein the module board has opposite first and second board surfaces, the contact pads being positioned along each of the first and second board surfaces.

4. The pluggable connector of claim 1, wherein the pluggable connector is capable of transmitting data at a rate of at least 20 Gigabits/second (Gbps).

5. The pluggable connector of claim 1, wherein each ground pathway includes only a single damping component.

6. The pluggable connector of claim 1, wherein the damping component includes at least one of a capacitor or an inductor.

7. The pluggable connector of claim 1, wherein the damping component is a discrete resistor.

8. The pluggable connector of claim 7, wherein the first and second trace segments include exposed platform surfaces that extend along a board surface of the module board, the damping component including first and second terminals that are coupled to the platform surfaces of the first and second trace segments, respectively.

9. The pluggable connector of claim 1, wherein the module board further comprises a ground plane that is within the module board a depth away from the board surface and that is electrically coupled to the ground pathways, each of the ground pathways extending between the ground plane and the respective contact pad that is proximate to the mating edge, wherein the plurality of ground pathways are parallel to one another along the board surface and are electrically commoned at the ground plane.

10. The pluggable connector of claim 9, wherein the ground pathways have corresponding electrical paths that extend from the ground plane to the respective contact pads, each of the damping components being positioned along the corresponding electrical path such that the damping component is closer to the ground plane than the contact pad.

11. The pluggable connector of claim 10, wherein each of the electrical paths has an electrical path length measured between the corresponding contact pad and the ground plane, the damping component being within one-fifth of the electrical path length from the ground plane.

12. The pluggable connector of claim 11, wherein the damping component is a discrete resistor and the pluggable connector is capable of transmitting data at a rate of at least 20 Gigabits/second (Gbps).

13. An interconnection system comprising:
a receptacle connector configured to be mounted to a circuit board and having a front side and a receiving cavity that opens to the front side, the receptacle connector including an array of electrical contacts disposed within the receiving cavity that are configured to be terminated to the circuit board; and
a pluggable connector configured to be inserted into the receiving cavity of the receptacle connector during a mating operation, the pluggable connector including a module board having a board surface and a plurality of signal pathways and a plurality of ground pathways in which the signal pathways are interleaved between corresponding ground pathways along the board surface, the signal and ground pathways including respective contact pads that are disposed proximate to a mating edge of the module board for engaging corresponding electrical contacts of the receptacle connector, wherein each of the ground pathways has separate first and second trace segments, the first trace segments of the ground pathways including the respective contact pads, the second trace segments of each ground pathway being separate from the second trace segments of each of the other ground pathways along the board surface, each of the ground pathways further comprising a damping component that electrically joins the first and second trace segments of the corresponding ground pathway along the board surface.

14. The interconnection system of claim 13, wherein the module board includes a component recess that extends between and separates the first and second trace segments, the damping component being at least partially disposed within the component recess.

15. The interconnection system of claim 13, wherein the interconnection system is capable of transmitting data at a rate of at least 20 Gigabits/second (Gbps).

16. The interconnection system of claim 13, wherein the damping component is a discrete resistor.

17. The interconnection system of claim 16, wherein the first and second trace segments include exposed platform surfaces that extend along a board surface of the module board, the damping component including first and second terminals that are coupled to the platform surfaces of the first and second trace segments, respectively.

18. The interconnection system of claim 13, wherein the module board of the pluggable connector further comprises a ground plane that is within the module board a depth away from the board surface and that is electrically coupled to the ground pathways, each of the ground pathways extending between the ground plane and the respective contact pad that is proximate to the mating edge.

19. The interconnection system of claim 18, wherein the first trace segment extends between the respective contact pad and the damping component and the second trace segment extends between the damping component and the ground plane, the second trace segment being electrically coupled to the ground plane through a ground via.

20. The interconnection system of claim 18, wherein the ground pathways have corresponding electrical paths that extend from the ground plane to the respective contact pads, each of the damping components being positioned along the corresponding electrical path such that the damping component is closer to the ground plane than the contact pad.

* * * * *